(12) United States Patent
Bauer et al.

(10) Patent No.: US 7,545,047 B2
(45) Date of Patent: Jun. 9, 2009

(54) SEMICONDUCTOR DEVICE WITH A WIRING SUBSTRATE AND METHOD FOR PRODUCING THE SAME

(75) Inventors: Michael Bauer, Nittendorf (DE); Edward Fuergut, Dasing (DE); Simon Jerebic, Regensburg (DE); Holger Woerner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 170 days.

(21) Appl. No.: 11/593,150

(22) Filed: Nov. 6, 2006

(65) Prior Publication Data

US 2007/0126122 A1 Jun. 7, 2007

Related U.S. Application Data

(63) Continuation of application No. PCT/DE2005/000840, filed on May 3, 2005.

(30) Foreign Application Priority Data

May 6, 2004 (DE) .................. 10 2004 022 884

(51) Int. Cl.
  *H01L 29/40* (2006.01)
(52) U.S. Cl. .............. 257/774; 257/686; 257/737; 257/738; 257/778; 257/E21.705; 257/E25.023
(58) Field of Classification Search .......... 257/686, 257/737, 738, 774, 778, E21.705, E25.023
See application file for complete search history.

(56) References Cited

U.S. PATENT DOCUMENTS

| 4,910,584 | A | * | 3/1990 | Mizuo ................... 257/713 |
| 6,271,469 | B1 | | 8/2001 | Ma et al. |
| 2001/0005044 | A1 | * | 6/2001 | Fjelstad .................. 257/678 |
| 2002/0041019 | A1 | * | 4/2002 | Gang ..................... 257/678 |
| 2002/0053730 | A1 | | 5/2002 | Mashino |
| 2003/0030143 | A1 | | 2/2003 | Wennemuth et al. |
| 2003/0153119 | A1 | | 8/2003 | Nathan et al. |
| 2003/0215993 | A1 | | 11/2003 | Oshima |
| 2004/0033673 | A1 | | 2/2004 | Cobbley et al. |
| 2006/0091561 | A1 | * | 5/2006 | Dangelmaier et al. ....... 257/778 |

FOREIGN PATENT DOCUMENTS

| DE | 10320646 A1 | 9/2004 |
| EP | 0920058 A2 | 6/1999 |
| WO | WO 02/15266 A2 | 2/2002 |
| WO | WO 03/015165 A2 | 2/2003 |
| WO | WO 03/103042 A2 | 12/2003 |

* cited by examiner

*Primary Examiner*—Andy Huynh
(74) *Attorney, Agent, or Firm*—Edell, Shapiro & Finnan, LLC (57) ABSTRACT

A semiconductor device with a wiring substrate as a stacking element for a semiconductor device stack is described herein. The wiring substrate includes a plastic frame of a first plastic compound and a central region of a second plastic compound. A semiconductor chip is embedded with its back side and its edge sides in the second plastic compound, the active upper side of the semiconductor device being in a coplanar area with the first and second plastic compounds.

17 Claims, 7 Drawing Sheets

SEMICONDUCTOR DEVICE WITH A WIRING SUBSTRATE AND METHOD FOR PRODUCING THE SAME

CROSS REFERENCE TO RELATED APPLICATIONS

This application is a continuation of International Application No. PCT/DE2005/000840, filed on May 3, 2005, entitled "Semiconductor Device with a Wiring Substrate and Method for the Production Thereof," which claims priority under 35 U.S.C. §119 to Application No. DE 102004022884.1 filed on May 6, 2004, entitled "Semiconductor Device with a Wiring Substrate and Method for the Production Thereof," the entire contents of which are hereby incorporated by reference.

BACKGROUND

In the case of conventional semiconductor devices with a wiring substrate, external contacts are arranged on the underside of the wiring substrate and at least one semiconductor chip, e.g., a memory device such as a DRAM, is arranged on the upper side of the wiring substrate, in the center of the upper side of the wiring substrate.

If a conventional device of this type is to be used as a stackable semiconductor device for a semiconductor module comprising stacked semiconductor devices, only the edge regions of the wiring substrate can be available for the attachment of external contacts of a stacked semiconductor device, since the center of the upper side of the wiring substrate is taken up by the semiconductor chip. The number and arrangement of external contacts of the semiconductor device to be stacked is therefore very restricted, such that many known types of packages, such as BGA (Ball Grid Array) or LGA (Land Grid Array) packages, cannot be stacked on a conventional semiconductor device with a wiring substrate.

Solutions to this stacking problem are known in the art. For stacking, conventional semiconductor devices with a BGA or LGA package are provided with additional flexible wiring films that have a larger surface area than the semiconductor devices to be stacked and protrude beyond the edge of the semiconductor devices, such that the flexible wiring films can be bent in the direction of a semiconductor device of a semiconductor device stack that is arranged underneath and can be electrically connected to the semiconductor device arranged underneath via the flexible film.

A semiconductor module with semiconductor devices stacked in such a manner has the disadvantage that the semiconductor devices cannot be stacked with the lowest possible space requirement, especially since the bent wiring film requires a large enough bending radius to avoid the risk of microcracks in the wiring lines arranged on the wiring film.

In addition, such a semiconductor module has the disadvantage that the thickness of each stage of the stack includes the thickness of the semiconductor chip and the considerable thickness of the wiring substrate.

SUMMARY

A semiconductor device with a wiring substrate as a stacking element for a semiconductor device stack is described herein. The wiring substrate includes a plastic frame of a first plastic compound and a central region of a second plastic compound. A semiconductor chip is embedded with its back side and its edge sides in the second plastic compound, the active upper side of the semiconductor device being in a coplanar area with the first and second plastic compounds.

The above and still further features and advantages of the device will become apparent upon consideration of the following definitions, descriptions and descriptive figures of specific embodiments thereof, wherein like reference numerals in the various figures are utilized to designate like components. While these descriptions go into specific details of the device and method, it should be understood that variations may and do exist and would be apparent to those skilled in the art based on the descriptions herein.

BRIEF DESCRIPTION OF THE DRAWINGS

The device and method are explained in more detail below with reference to exemplary embodiments, where.

DETAILED DESCRIPTION

A semiconductor device with a wiring substrate and a method for the producing the same, are described herein. The semiconductor device is produced such that any number of devices can be stacked one on top of the other to form a semiconductor module. Furthermore, this stackable device can be combined with various base devices and uppermost semiconductor devices that are constructed in a variety of ways, to form a semiconductor module. In addition, a semiconductor device with a wiring substrate is described herein. The device with the wiring substrate can be stacked with various semiconductor devices. The wiring substrate permits the assignment of external contacts to be varied such that the contacts can be aligned according to the device to be stacked. Therefore, the space requirement and the area requirement of a semiconductor module can be minimized.

According to the described device, a semiconductor device with a wiring substrate is provided as a stacking element for a semiconductor device stack. For this purpose, the wiring substrate forms an underside and an upper side of the semiconductor device. Arranged both on the underside and on the upper side of the semiconductor device, at least in an edge region of the wiring substrate, are external contact pads, which are electrically in connection via contact vias extending through the wiring substrate. The contact vias are arranged extending through the wiring substrate in a first plastic compound and surround with this first plastic compound a semiconductor chip which is arranged in the volume of the wiring substrate and is embedded with its back side and its edge sides in a second plastic compound of the wiring substrate. The underside of the wiring substrate with its external contact pads and the active upper side of the semiconductor chip with its contact areas have a common coplanar area.

The semiconductor device has the advantage that, as a stacking element, it only has the thickness of a wiring substrate with contact vias, since the semiconductor chip is arranged in the volume of the wiring substrate. A further advantage is provided by the coplanar area which is formed by the active upper side of the semiconductor chip and by the underside of the wiring substrate composed of two plastic compounds. Consequently, any desired wirings can be carried out on this underside by applying a correspondingly structured wiring layer between the contact areas of the semiconductor chip and the external contact pads. The same applies to the upper side of the semiconductor device, which is formed by the upper side of the wiring substrate and includes external contact pads which can be connected by way of contact vias and by way of a wiring structure to the contact areas of the semiconductor chip on the underside of the wiring substrate.

Furthermore, the upper external contact areas may be coated with a solder layer, in order to stack further semiconductor devices, and also semiconductor devices of the same type. While it has been the practice for stacking until now to provide an interconnecting substrate or interconnecting film to permit stacking of semiconductor devices, it is possible in the case of the stacking element according to the described device to omit such interconnecting parts. Consequently, a greater complexity and higher stacking density are achieved. The function of such an interconnecting substrate or such an interconnecting film is undertaken here by the wiring structure which can be provided on the coplanar area on the underside of the wiring substrate or of the semiconductor device.

In a further embodiment, the coplanar area is initially covered by an insulating layer which has windows to the contact areas of the semiconductor chip and to the external contact pads of the underside of the wiring substrate. Such an insulating layer has the advantage that it can bridge transitions from the semiconductor chip material of the active upper side of the semiconductor chip to the first and second plastic compounds of the wiring substrate in the plane of the coplanar area and can increase the dielectric strength. The windows to the contact areas and to the external contact pads may be made in the insulating layer by laser ablation or by photolithographic methods with a subsequent dry or wet etching technique.

The structured wiring layer may be applied to the insulating layer and establish the connection to the external contact areas of the semiconductor chip and the contact pads of the underside of the wiring substrate. The structured wiring layer may also be applied directly to the coplanar area, especially since the upper side of the semiconductor chip has an insulating passivation layer and the first and second plastic compounds are insulating. The structured wiring layer permits either only the edge regions of the semiconductor device to be provided with external contacts on the underside, or else external contacts to be distributed over the entire underside of the semiconductor device. The same advantage is also obtained for the upper side of the semiconductor device if a corresponding structured wiring layer is provided there. Such a structured wiring layer may subsequently be covered by a solder resist layer, which allows access to the external contact pads of the underside of the wiring substrate.

The structuring of the solder resist layer may in turn be performed by measures based on photoresist techniques. The advantage of providing the underside of the semiconductor device, or the wiring substrate, with a solder resist layer apart from the external contact pads is that, when the external contacts are soldered onto the external contact pads, the wiring lines of the wiring layer are protected from being wetted with solder material, in particular if the external contacts include solder balls or a solder layer.

A structured wiring layer is provided on the upper side with an array of external contact pads in such a way that they are congruent with an array of external contact pads or external contacts of a semiconductor device to be stacked, thereby permitting electrical connection. Consequently, the semiconductor device has the advantage that any desired arrays can be provided on its upper side for semiconductor devices to be stacked.

The described device can be used to produce a semiconductor device module which has a stack of the semiconductor devices described above as stacking elements. In this case, the stacking elements may be identically formed and include external contacts on the edge regions of the respective wiring substrate, thereby allowing for the lowermost semiconductor device as the semiconductor base device to comprise an array of external contacts corresponding to the arrays of surface-mountable semiconductor devices.

In a further embodiment, the upper side of the semiconductor device module may include a structured wiring layer, with which it is possible to arrange both passive and surface-mountable active devices on the uppermost semiconductor device of the semiconductor device stack. These devices are electrically in connection with the semiconductor devices of the semiconductor device module arranged underneath.

In addition, it is possible to provide as the uppermost stacked semiconductor device a semiconductor device with an internal chip stack comprising two semiconductor chips. In the case of this internal semiconductor chip stack, preferably at least one semiconductor chip comprises flip-chip contacts, while the second semiconductor chip forms, with the plastic compound which surrounds the semiconductor chip stack, a coplanar area on which a correspondingly structured wiring layer is provided.

A panel for a number of semiconductor devices is described herein. The semiconductor devices are provided on the panel in appropriate device positions, the device positions being arranged on a removable carrier film. Such a panel for a number of identical semiconductor devices which can be used as stacking elements on the basis of the construction according to the described device can be produced and offered as a composite board. This composite board may for example be divided by the end user into individual stackable semiconductor devices.

A method for producing a panel is described herein. First, a carrier film is provided on a carrier. This carrier may at the same time be a mold half of a molding tool if it is considered to produce the panel by molding.

A mold part of a dispensing process may also be provided as the carrier, the carrier film being placed in the dispensing mold. Subsequently, a plastic frame previously prepared in a parallel process and comprising a first plastic compound is applied to the carrier film. This plastic frame includes a number of device positions arranged in rows and columns, and surrounds each of the device positions with a corresponding frame.

Arranged in this first plastic compound of the plastic frame are contact vias, which electrically connect the external contact pads on the upper side of the plastic frame and on the underside of the plastic frame to one another. The plastic frame encloses in the center of the device positions a free area of the carrier film. A semiconductor chip is applied to this free area within the plastic frame, with its active upper side fixed on the carrier film. Subsequently, the plastic frame can be filled while embedding the back side and the edge sides of the semiconductor chip in a second plastic compound, such that a coplanar area is created on the underside of the carrier film and a planar area forms the upper side of the panel.

Next, the carrier and the carrier film are removed, so as to obtain a self-supporting (i.e., rigid) composite board with a coplanar area comprising the active upper sides of the semiconductor chips and the undersides of the surrounding first and second plastic compounds with a wiring structure. However, this wiring structure only includes external contact pads on the upper side and the underside of the composite board. In addition, a structured wiring layer may be applied to the coplanar area, the contact areas of the active upper side of the semiconductor chips being connected to external contact pads of the plastic frame.

This method has the advantage of creating a panel in the form of a composite board with which many semiconductor devices are simultaneously available in a parallel type of production as stacking elements with the panel created. A further advantage is that the upper side of this panel, which only has external contact pads in the device positions, can also be provided with a further wiring structure in order to provide uniformly distributed external contact pads both on the underside and on the upper side. This has the added advantage that, when stacking, not only can a connection between semiconductor devices be established in the regions of the semiconductor devices but also the entire area of a device position is available for arranging external contacts, both on the underside and on the upper side.

In the case of a preferred embodiment of carrying out the method, the semiconductor chips are applied to the carrier film within the plastic frame via an adhesive bonding technique. For this purpose, the carrier film may include a corresponding adhesive layer. Before the panel is separated into individual semiconductor devices, the external contact pads may also be reinforced, in order to provide semiconductor devices for surface mounting or the external contacts are already applied in the form of solder balls to the respective external contact pads and subsequently, the panel is separated into individual semiconductor devices.

To produce a semiconductor module with stacked semiconductor devices, it is then merely required to stack the semiconductor devices separated from the panel one on top of the other. Their external contact pads or their external contacts are thereby electrically connected to one another. For stacking, it is possible by appropriate structuring of the wiring layers on the underside and/or on the upper side to provide contact pad arrangements which permit different semiconductor devices with corresponding external contact structures on this semiconductor device comprising a wiring substrate.

In summary, it can be stated that the described device permits stacking of semiconductor packages that are independent of one another. For this purpose, a package technology is modified and a previously unstructured frame material of plastic is provided with contact vias and external contact pads, thereby obtaining a universal stacking element comprising a wiring substrate with a semiconductor chip incorporated in its volume. This stacking element is a complete semiconductor device and can also be sold as a semiconductor base device. Since this device has contact pads both on the upper side of its package and on the underside of its package, it can be mounted with any other desired semiconductor devices or packages to form a stack or a semiconductor module.

The advantages of the described device include:

1. On account of the so-called "build-up" technique, high wiring densities are obtained, and consequently a greater area is available for the vertical contacting. In addition, smaller packages can be produced with greater freedom of design.

2. Multiple stacks can be achieved, especially since the number of stacking elements per stack is not limited.

3. Spatially compressed stacks can be produced if a direct connection is obtained between the contact pads via butt-soldering the semiconductor devices in the stack to one another.

4. Furthermore, an improved electrical configuration, an improved form factor, a higher wiring density and a reliable production process of large-area panels are obtained for manufacturing a variety of semiconductor devices according to the described device.

In the following paragraphs, exemplary embodiments of the device and method are described in connection with the figures.

Figure 1:
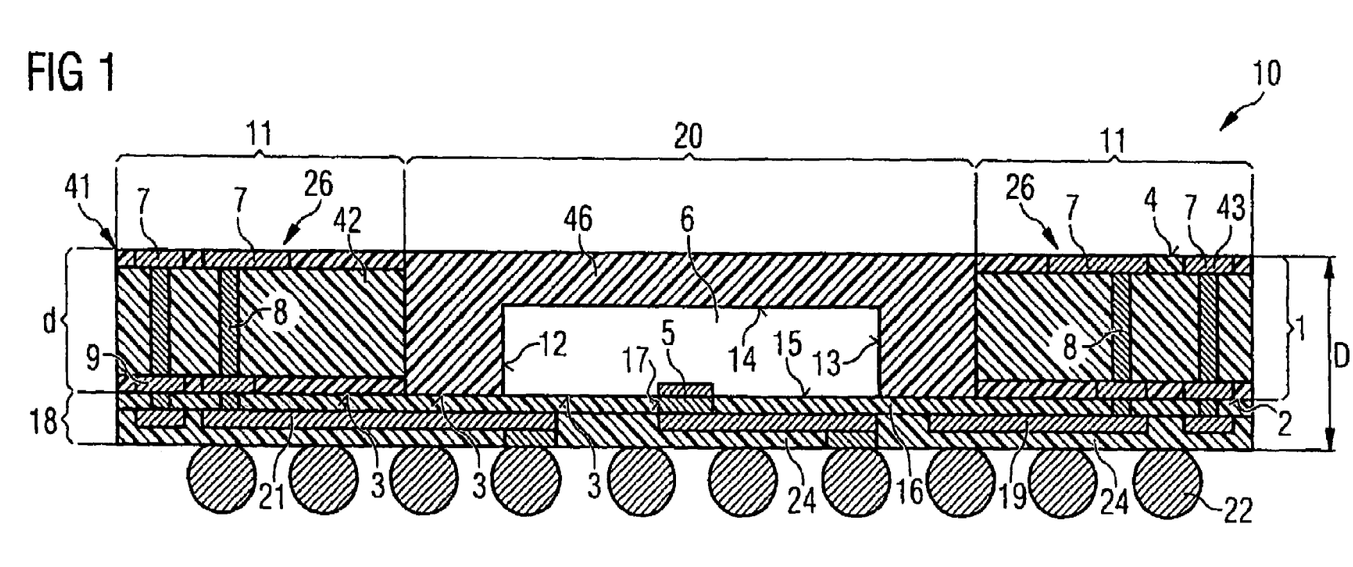
FIG. 1 shows a schematic cross section through a semiconductor device.

FIG. 1 shows a schematic cross section through a semiconductor device 10 according to the described device. The semiconductor device 10 comprises a plastic frame 41 of a first plastic compound 42 in an edge region 11 of the semiconductor device 10 and a second plastic compound 46 in a central region 20 of the semiconductor device 10. The thickness D of the device corresponds approximately to the thickness d of a wiring substrate. The wiring substrate comprises the plastic frame 41 and the central region 20. On the underside 2, the wiring substrate 1 further comprises a coplanar area 3 including the active upper side 15 of a semiconductor chip 6 arranged in the central region 20 and the undersides of the plastic compounds 42 and 46. External contact pads 9 integrated in the plastic frame 41 are disposed on the underside 2 of the wiring substrate 1 and in the edge region 11 on the coplanar area 3. Arranged on the upper side 4 of the wiring substrate 1 in the edge region 11 are external contact pads 7. The external contact pads 7 are electrically connected with the external contact pads 9 via contact vias 8.

The semiconductor chip is surrounded by the second plastic compound 46 on its back side 14 and on its edge sides 12 and 13. Only the active upper side 15 with the contact area 5 is exposed and free from the plastic compound, such that access to the contact area 5 is possible from the coplanar area 3. In the embodiment as shown by FIG. 1, a three-level wiring layer 18 is arranged on the underside of the wiring substrate 1. The three-level wiring layer 18 comprises three layers. First, an insulating layer 16 is applied to the coplanar area 3 as the first level. The insulating layer 16 includes windows 17. These windows 17 permit access to the semiconductor chip contact area 5 and access to the external contact pads 9 of the plastic frame 41. A wiring structure 21 is arranged on the insulating layer 16 as the second level. The wiring structure 21 comprises wiring lines 19 connecting the plastic frame external contact pads 9 to external contacts 22 of the semiconductor device and to the semiconductor chip contact areas 5. The third level of the wiring layer 18 is a solder resist layer 24. The solder resist layer 24 permits access via the semiconductor device external contacts 22 to corresponding external contact pads of the wiring structure 18 via corresponding windows in the solder resist layer 24. Further semiconductor devices may be stacked on this device 10, at least in the edge regions 11, while contacting the upper side external contact pads 7 of the wiring substrate 1.

For applications in which external contact areas 7 in the central region 20 of the semiconductor device 10 are also to be made available on the upper side 4 of the semiconductor device 10, a corresponding two- or three-level wiring layer 18 is also applied to the upper side 4 of the wiring substrate 1. By incorporating the semiconductor chip 6 and its connections in the volume of the wiring substrate 1, the thickness D of the semiconductor device 10 is reduced to a minimum and the access to the contact areas 5 of the semiconductor chip 6 via the external contact areas 9 is permitted, both from the upper side 4 and from the underside 2 of the wiring substrate 1. In this case, the array 26 of the external contact pads 7 on the upper side 4 of the wiring substrate 1 can be adapted to the array 26 of external contacts 22 of a stacked semiconductor device via appropriate provision of a further wiring layer 23 on the upper side 4 of the wiring substrate.

FIGS. 2 to 5 show schematic cross sections through components of individual method stages in the production of a semiconductor device 10 according to FIG. 1.

Figure 2:
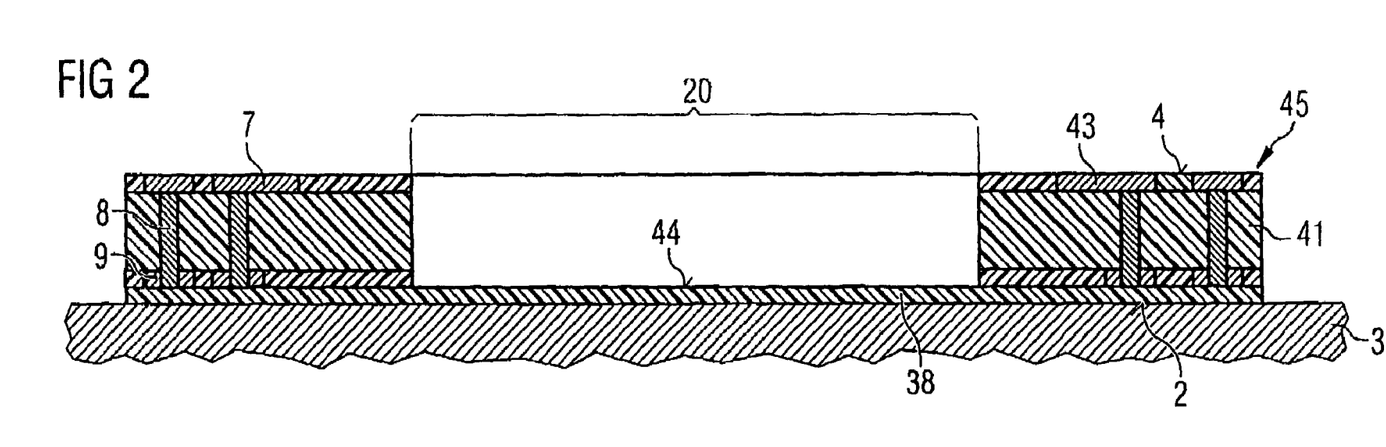
FIG. 2 shows a schematic cross section of a plastic frame of a single device position of a panel.

FIG. 2 shows a schematic cross section of a plastic frame 41 of a single device position 45 of a panel. For this purpose, a carrier 39 is provided with a carrier film 38 and individual plastic frames are adhesively attached to the carrier film 38. Alternatively, one large-area plastic frame 41 with individual device positions 45 is adhesively attached to the carrier film 38. These plastic frames 41 already include external contact pads 9 on their undersides 2. Embedded in the volume of the plastic frames 41 are contact vias 8, which electrically connect the underside external contact pads 9 of the plastic frame to upper side external contact pads 7 of the plastic frame 41 and consequently form a three-dimensional first wiring structure 43.

Figure 3:
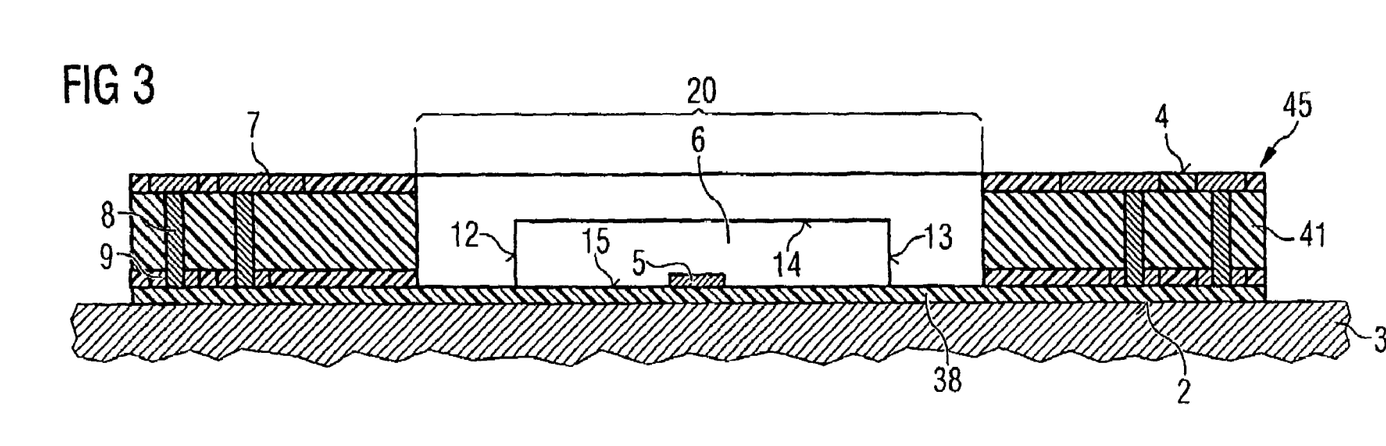
FIG. 3 shows a schematic cross section of a plastic frame according to FIG. 1 with a semiconductor chip.

FIG. 3 shows a schematic cross section of a plastic frame 41 according to FIG. 1 with a semiconductor chip 6. The central region 20 of the device position 45 that is shown in FIG. 2 is surrounded by the plastic frame 41 and allows access to an exposed area 44 of the carrier film 38. In FIG. 3, a semiconductor chip 6 is then adhesively attached with its active upper side 15 onto the carrier film 38 in the central region 20, so that the contact area 5 of the semiconductor chip 6 lies on the carrier film 38. Consequently, in FIG. 3, the underside 2 of the plastic frame 41 and the active upper side 15 of the semiconductor chip 6 are aligned in a coplanar manner.

Figure 4:
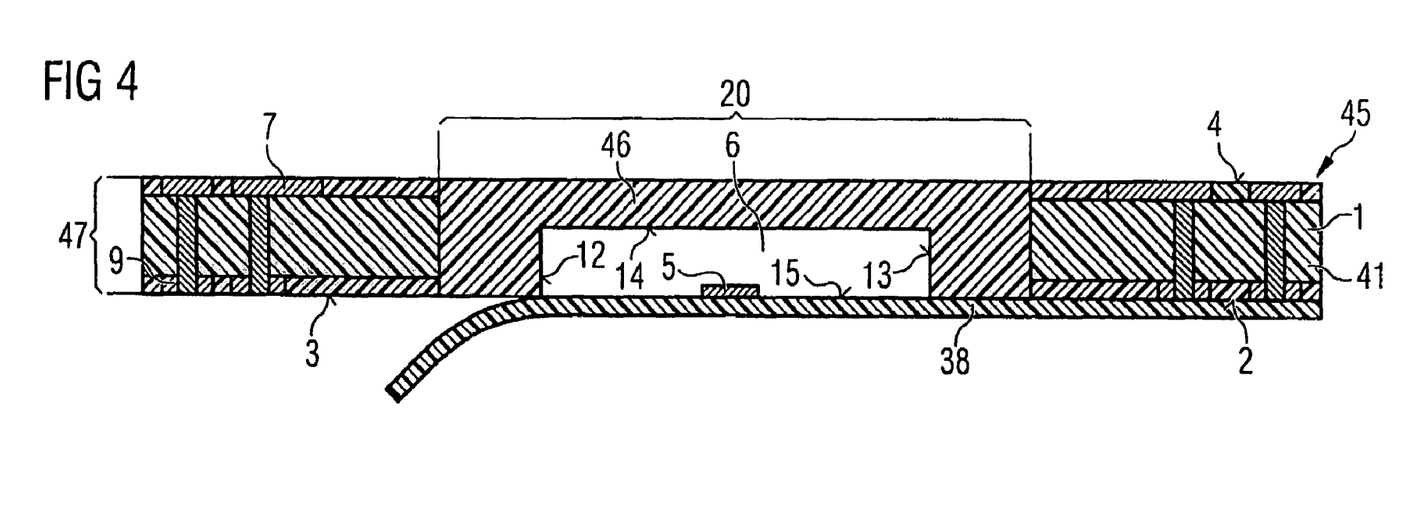
FIG. 4 shows a schematic cross section of a plastic frame according to FIG. 3 with a filled recess to form a composite board.

FIG. 4 shows a schematic cross section of a plastic frame 41 according to FIG. 3 with a filled recess to form a composite board 47. Therefore, the semiconductor chip 6 is embedded with its back side 14 and its edge sides 12 and 13 into a second plastic compound 46, which fills the central region 20. The filling of the recess is likewise carried out in all the device positions of a panel such that a composite board 47 is produced. The composite board 47 is dimensionally stable and self-supporting (i.e., rigid). The carrier film 38 is removed from this dimensionally stable and self-supporting composite board 47, as shown in FIG. 4, such that the underside 2 then represents a coplanar area 3, on which the underside external contact pads 9 and the semiconductor chip contact area 5 are arranged.

Figure 5:
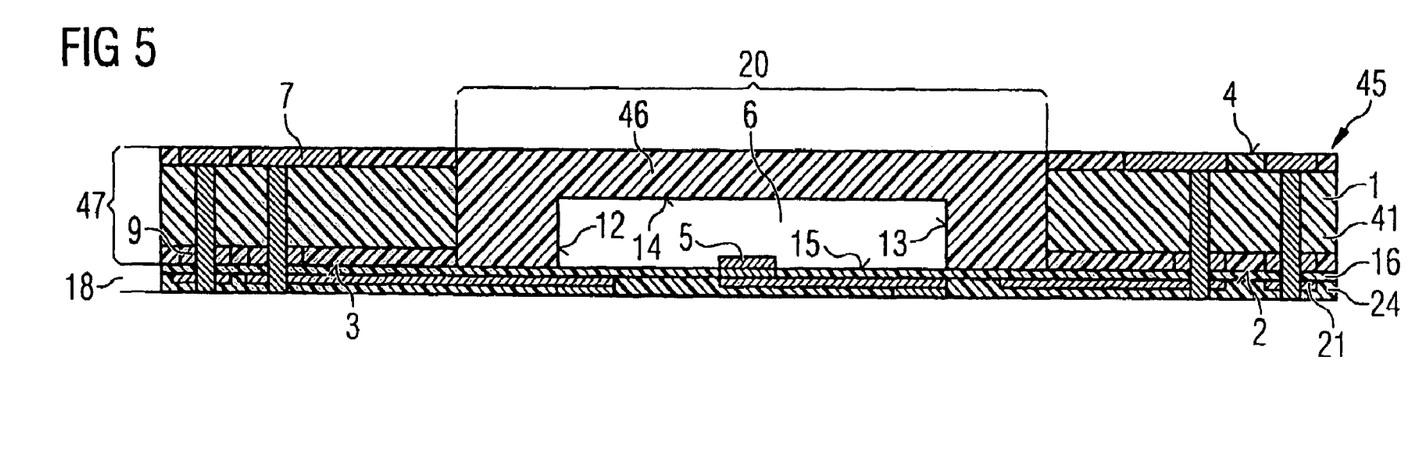
FIG. 5 shows a schematic cross section of a composite board according to FIG. 4 with a wiring layer on its underside.

FIG. 5 shows a schematic cross section of a composite board 47 according to FIG. 4 with a wiring layer 18 on its underside 2. This three-level wiring layer 18 is applied to the coplanar upper side 3 of the wiring substrate 1 after the carrier film has been pulled off. As already discussed and shown in FIG. 1, this wiring layer 18 is a three-level wiring layer 18 comprising an insulating layer 16, a wiring structure 21 and a solder resist layer 24.

Figure 6:
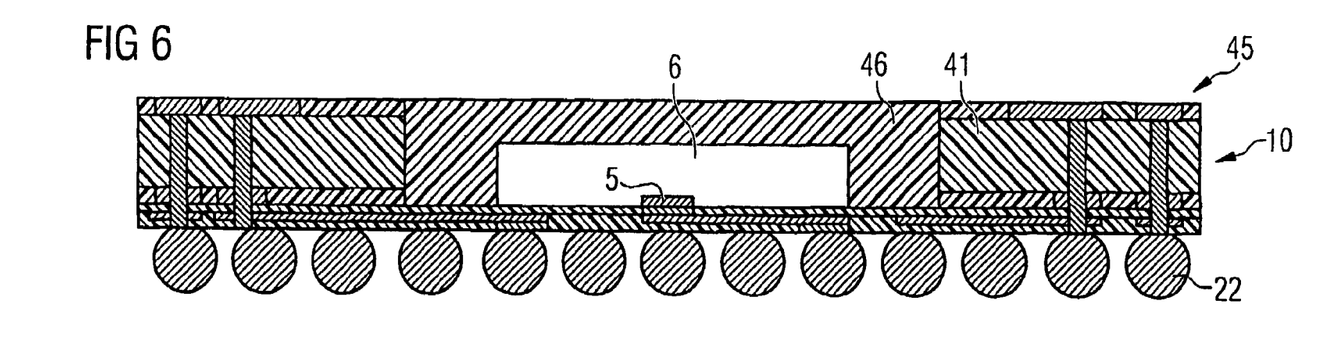
FIG. 6 shows a schematic cross section of a finished semiconductor device according to FIG. 1.

FIG. 6 shows a schematic cross section of a finished semiconductor device 10 according to FIG. 1. In order to finish the semiconductor device 10, the device position 45 shown in FIG. 5 is cut out from the composite board and semiconductor device external contacts 22 are provided at intended locations on the underside. An alternative possibility is to provide the semiconductor device external contacts 22 on each of the device positions 45 of the panel, as is shown in FIG. 5, and then divide up the panel into individual semiconductor devices 10. This semiconductor device 10, shown in FIG. 6, can be used as a semiconductor base device 27 of a stack.

Figure 7:
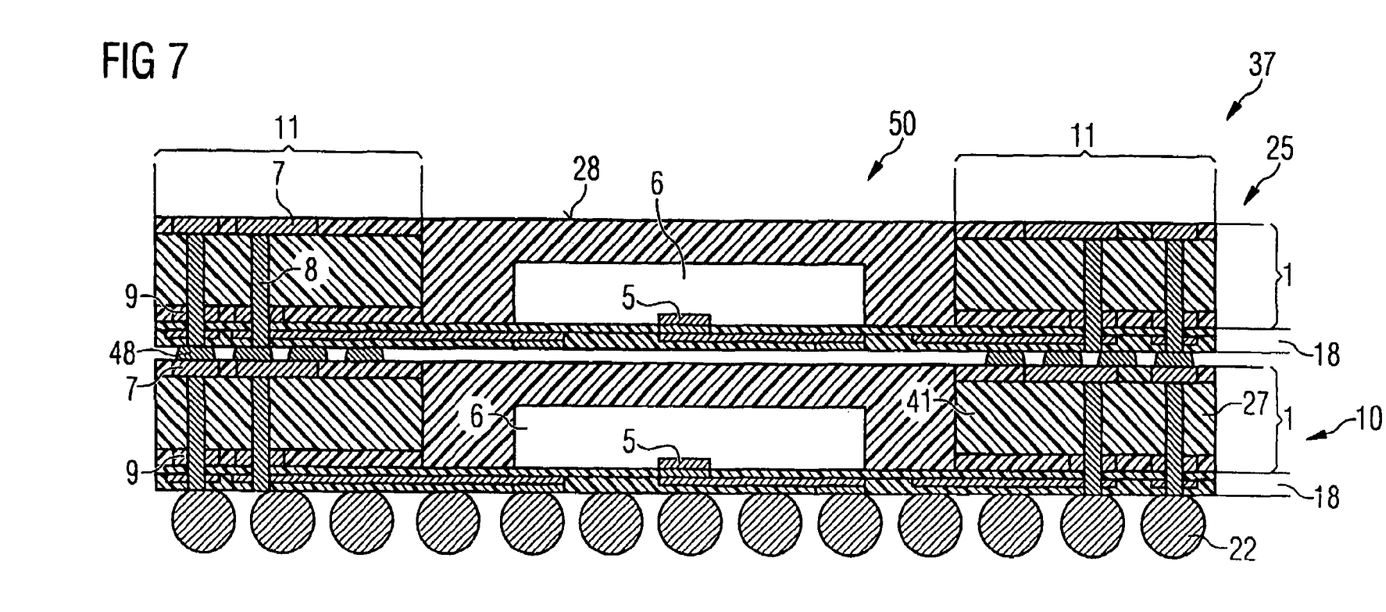
FIG. 7 shows a schematic cross section through a semiconductor device module with two semiconductor devices according to a first embodiment.

FIG. 7 shows a schematic cross section through a semiconductor device module 37 with two semiconductor devices 10 and 50 according to the first embodiment of the described device. In order to join these two semiconductor devices 10 and 50 together to form a semiconductor device stack 25, the underside external contact pads 9 on the underside of the stacked semiconductor device 50 are reinforced by a solder layer 48 and subsequently soldered onto the upper side external contact pads 7 on the upper side 4 of the semiconductor device 10. Since the underside external contact pads 9 are connected to the contact areas 5 of the semiconductor chip 6 of the stacked semiconductor device 50 via the wiring layer 18 of the stacked semiconductor device 50, there is also a connection to the contact areas 5 of the semiconductor chip 6 of the semiconductor base device 27. While the external contacts 22 of the semiconductor base device 27 are uniformly distributed over the underside, the coupling between the stacked semiconductor device 50 and the base semiconductor device 27 takes place only via the edge regions 11, which are formed by the plastic frame 41 of each semiconductor device 10 and 50.

Figure 8:
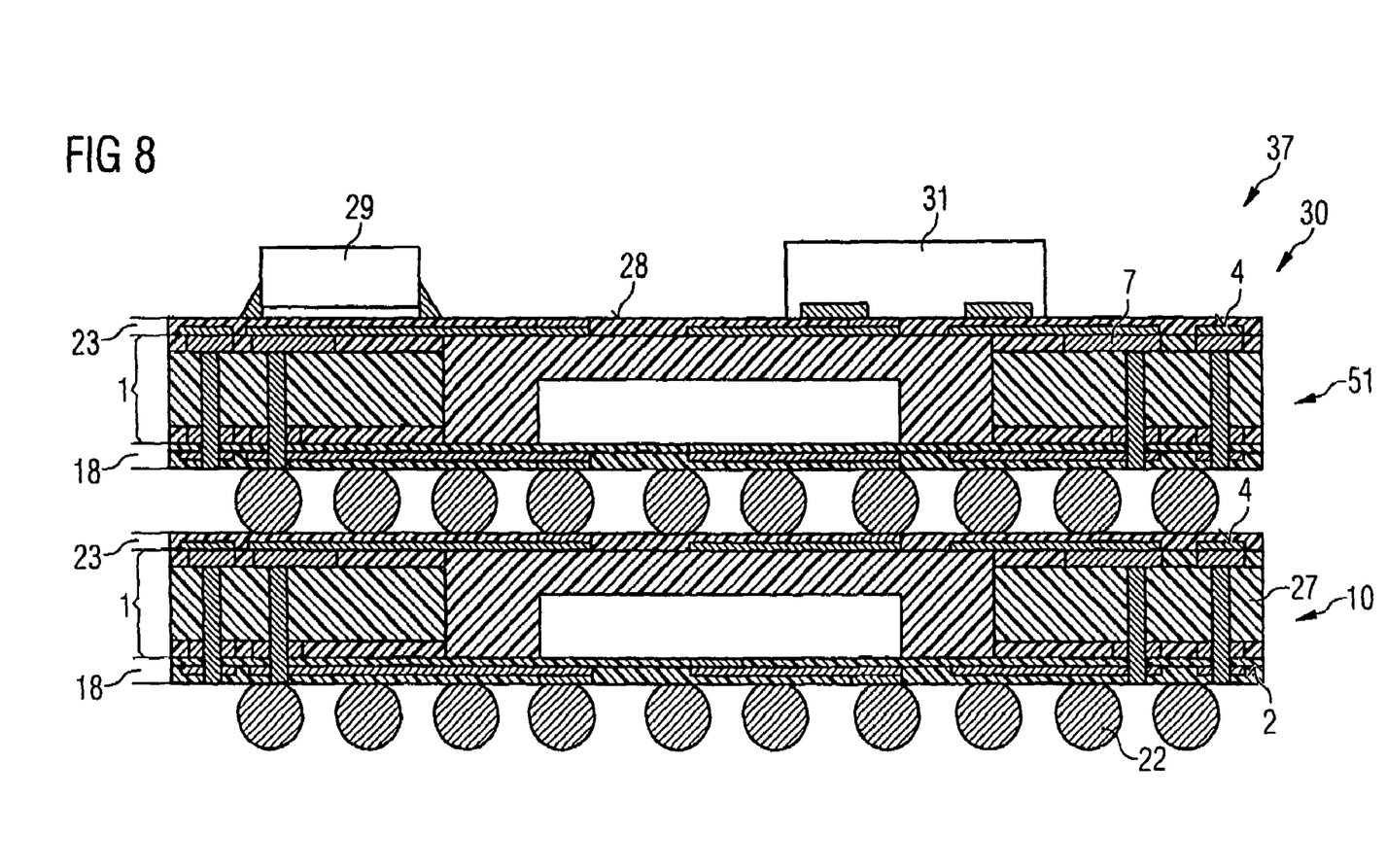
FIG. 8 shows a schematic cross section through a semiconductor device module with two stacked semiconductor devices and a passive device according to a second embodiment.

FIG. 8 shows a schematic cross section through a semiconductor device module 37 with freely stacked (i.e., in physical contact with one another and being electrically connected but, not mechanically connected) semiconductor devices 10 and 51 of a second embodiment of the invention. Components with the same functions as in the previous figures are identified in the further figures by the same designations and are not separately explained. The difference between the second embodiment and the first embodiment is that both the semiconductor base device 27 and the stacked semiconductor device 51 have an upper wiring structure 23 on the upper side 4 of the wiring substrate 1. Alternatively, it is possible to provide the stacked semiconductor device 51 with semiconductor device external contacts 22, which are distributed over the entire underside 2 of the wiring substrate 1. It is also possible to arrange on the upper side 28 of the semiconductor device stack 30 passive devices 29 and surface-mountable active devices 31 which require an entirely different array for the external contact pads 7 on the upper side 28 of the semiconductor module 30.

Figure 9:
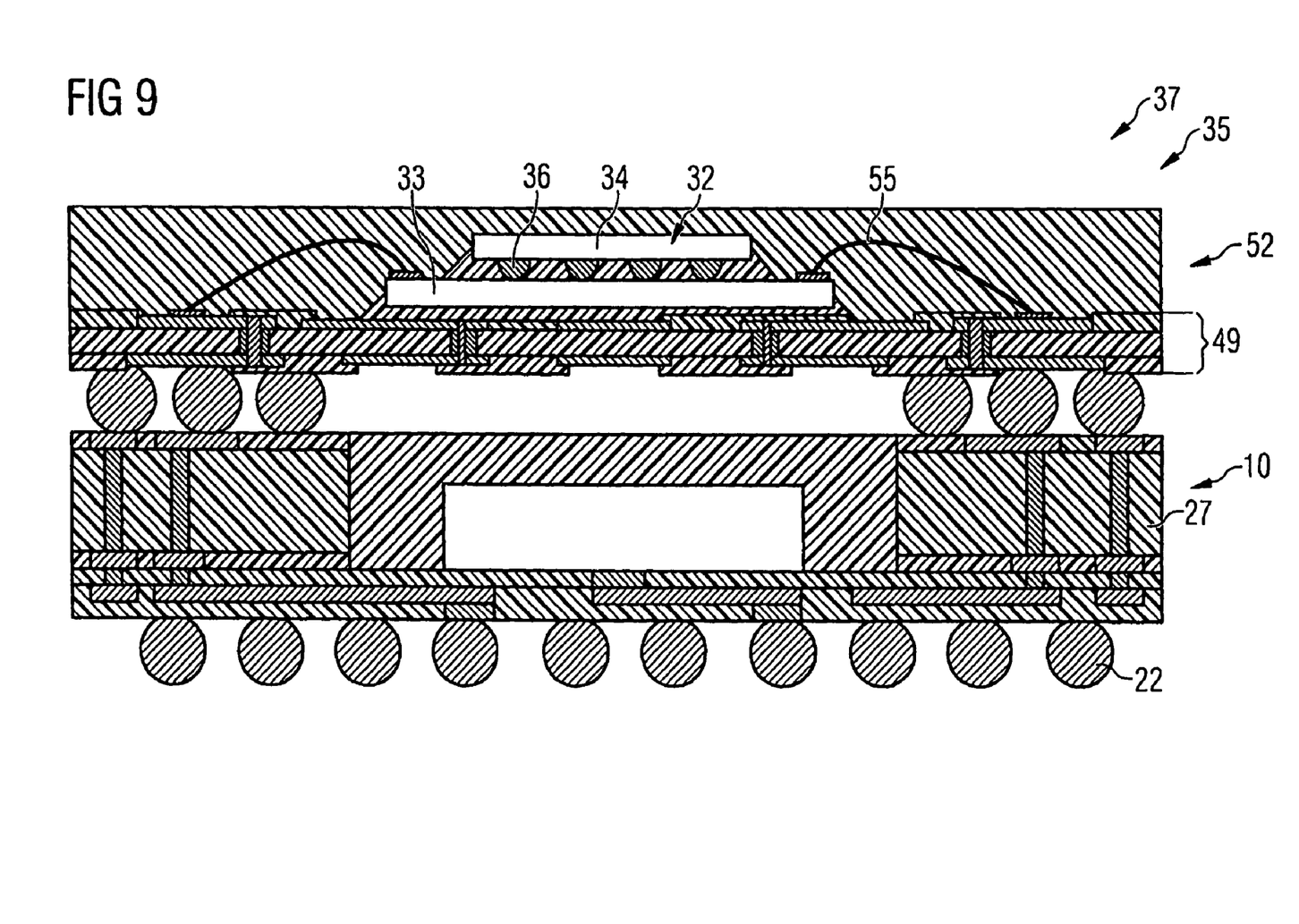
FIG. 9 shows a schematic cross section through a semiconductor device module with two stacked semiconductor devices according to a third embodiment.

FIG. 9 shows a cross section through a semiconductor device module 37 comprising a semiconductor stack 35 with two stacked semiconductor devices 10 and 52 of a third embodiment. While the base semiconductor device 27 corresponds to the semiconductor device 10 that is shown in FIG. 1, the stacked semiconductor device 52 differs from the previously stacked semiconductor devices 50 and 51 of the previous figures in that an internal chip stack 32 with a lower semiconductor chip 33, which is arranged with its passive back side on a wiring board 49, is provided. This lower semiconductor chip 33 is connected to the wiring structure of a wiring board 49 of the stacked semiconductor device 52 via bonding wires 55 and carries on its upper side the stacked semiconductor chip 34, which is connected via flip-chip contacts 36 to contact areas 5 of the lower semiconductor chip 33. The semiconductor chip module 37 shows how versatile the stacking element or the semiconductor base device 27 can be.

Figure 10:
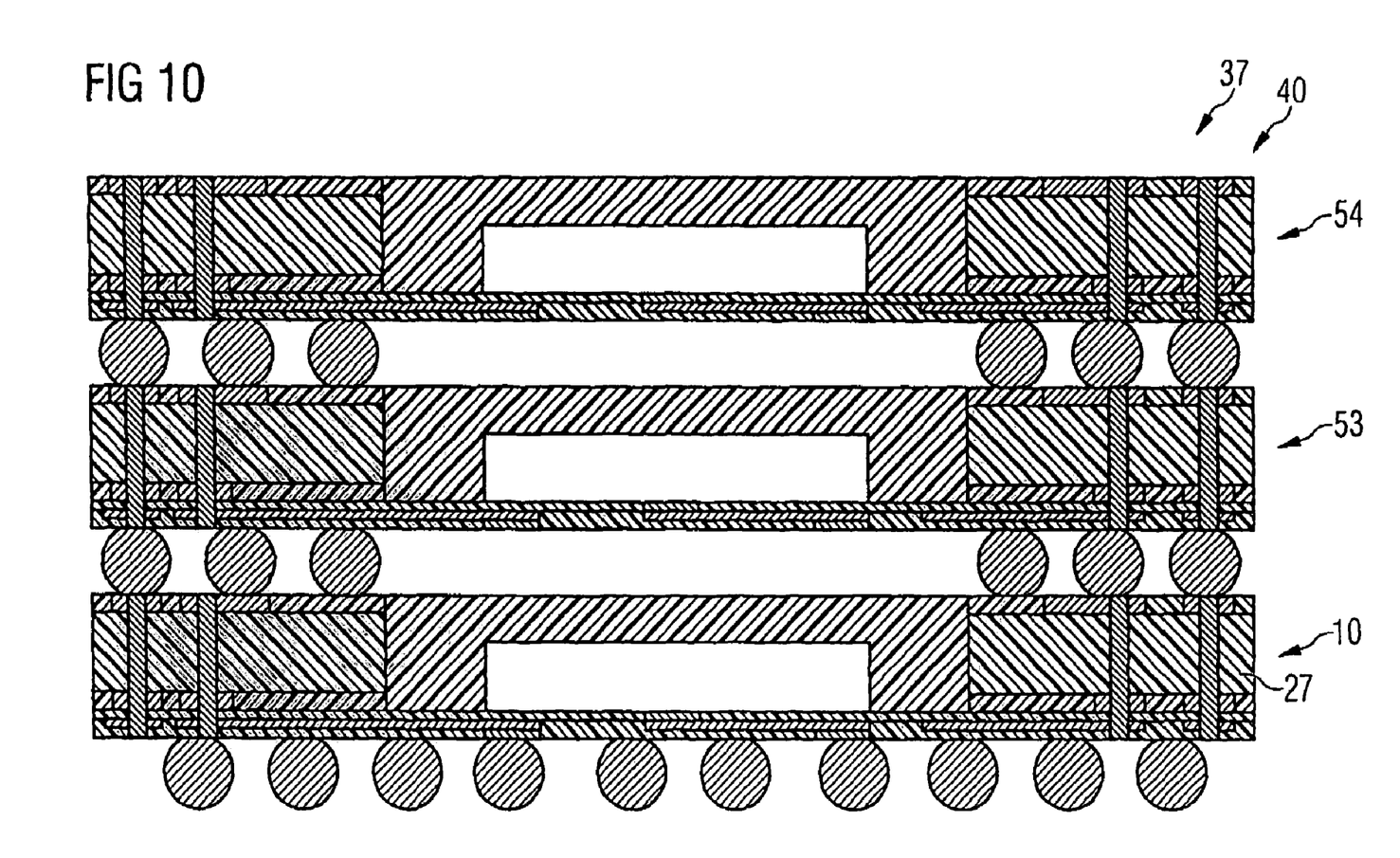
FIG. 10 shows a schematic cross section through a semiconductor device module with three stacked semiconductor devices according to a fourth embodiment.

FIG. 10 shows a schematic cross section through a semiconductor device module 37 comprising a semiconductor device stack 40 with three stacked semiconductor devices 10, 53 and 54 of a fourth embodiment. Such a semiconductor device stack 40 comprising three virtually identical semiconductor devices, as shown in FIG. 1, has the advantage that any module capacity can be achieved relatively inexpensively and the stack can be supplemented with further semiconductor devices as desired.

While the device and method have been described in detail with reference to specific embodiments thereof, it will be apparent to one of ordinary skill in the art that various changes and modifications can be made therein without departing from the spirit and scope thereof. Accordingly, it is intended that the described device and method covers the modifications and variations of this device and method provided they come within the scope of the appended claims and their equivalents.

What is claimed is:

1. A semiconductor device comprising:
   a wiring substrate operable as a stacking element for a semiconductor device stack, the wiring substrate forming an underside and an upper side of the semiconductor device, the wiring substrate comprising: a plastic frame of a first plastic compound, the plastic frame being disposed in an edge region that surrounds a central region of the semiconductor device; and a second plastic compound disposed in the central region;
   a plurality of external contact pads disposed on the underside and the upper side of the wiring substrate and arranged in at least the edge region of the wiring substrate;
   a plurality of contact vias extending through the wiring substrate and electrically connecting upper side external contact pads to underside external contact pads; and
   a semiconductor chip including an active upper side with chip contact areas, the semiconductor chip embedded with its back side and its edge sides in the volume of the wiring substrate, the semiconductor chip being at least partially surrounded by the contact vias;
   wherein the underside of the wiring substrate with underside external contact pads and the active upper side of the semiconductor chip with chip contact areas form a coplanar area.

2. The semiconductor device according to claim 1, wherein the coplanar area is covered by an insulating layer including windows exposing the chip contact areas and the underside external contact pads of the wiring substrate.

3. The semiconductor device according to claim 1, wherein the coplanar area carries a structured wiring layer with wiring lines, the structured wiring layer extending between underside external contact pads of the wiring substrate and chip contact areas of the semiconductor chip.

4. The semiconductor device according to claim 3, wherein the structured wiring layer is covered by a solder resist layer such that the solder resist layer allows access to the underside external contact pads of the wiring substrate.

5. The semiconductor device according to claim 1, wherein the underside external contact pads of the wiring substrate comprise semiconductor device external contacts.

6. The semiconductor device according to claim 5, wherein the semiconductor device external contacts comprise solder balls.

7. The semiconductor device according to claim 1, wherein the upper side of the wiring substrate comprises a structured wiring layer electrically connecting the upper side external contact pads in the edge region of the wiring substrate to external semiconductor device contact pads disposed on the entire upper side of the semiconductor device, the upper side external semiconductor device contact pads being arranged in positions of a predetermined array corresponding to positions of underside semiconductor device external contacts of a semiconductor device to be stacked.

8. A semiconductor device module comprising:
   a stack of semiconductor devices, the stack including a semiconductor device according to claim 1 as a stacking element.

9. A semiconductor device module comprising: a stack of semiconductor devices, the stack including a semiconductor device according to claim 1 as a semiconductor base component.

10. The semiconductor device module according to claim 9, wherein the coplanar area carries a structured wiring layer with wiring lines, the structured wiring layer extending between underside external contact pads of the wiring substrate and chip contact areas of the semiconductor chip.

11. The semiconductor device module according to claim 9,
   wherein the stack further comprises a wiring structure disposed on an upper side of the stack, the wiring structure including at least one further device electrically connected to the semiconductor devices of the stack via the wiring structure;
   wherein the at least one further device is one of: a passive device and a surface-mountable semiconductor device.

12. The semiconductor device module according to claim 9, wherein the stacked semiconductor device further comprises an internal chip stack comprising a plurality of semiconductor chips wherein at least one of the semiconductor chips comprises flip-chip contacts.

13. The semiconductor device module according to claim 9, wherein the stack comprises a plurality of stacked semiconductor devices the same type, each of the stacked semiconductor devices including a coplanar area that carries a structured wiring layer with wiring lines, the structured wiring layer extending between underside external contact pads of a wiring substrate and chip contact areas of a semiconductor chip.

14. A panel for a plurality of semiconductor devices according to claim 1, the panel comprising at least one device position on a removable carrier film.

15. The semiconductor device of claim 1, wherein the plastic frame in the edge region and the second plastic compound in the central region extend from the coplanar underside of the wiring substrate to the upper side of the wiring substrate.

16. The semiconductor device of claim 1, wherein the contact vias extend through the plastic frame in the edge region of the wiring substrate.

17. The semiconductor device of claim 1, wherein the semiconductor chip is disposed within the central region and is embedded in the second plastic compound on its back and sides faces.

* * * * *